(12) United States Patent
Yoon et al.

(10) Patent No.: US 8,590,144 B2
(45) Date of Patent: Nov. 26, 2013

(54) METHOD OF MANUFACTURING PRINTED CIRCUIT BOARD

(75) Inventors: Hye Sun Yoon, Seoul (KR); Jae Bong Choi, Seoul (KR); Eun Jung Lee, Seoul (KR); Jung Ho Hwang, Seoul (KR); Joon Wook Han, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 324 days.

(21) Appl. No.: 12/919,914

(22) PCT Filed: Mar. 2, 2009

(86) PCT No.: PCT/KR2009/001010
§ 371 (c)(1),
(2), (4) Date: Aug. 27, 2010

(87) PCT Pub. No.: WO2009/108030
PCT Pub. Date: Sep. 3, 2009

(65) Prior Publication Data
US 2011/0000704 A1    Jan. 6, 2011

(30) Foreign Application Priority Data

Feb. 29, 2008  (KR) .................. 10-2008-0019337
Dec. 29, 2008  (KR) .................. 10-2008-0136022

(51) Int. Cl.
*H05K 1/03*       (2006.01)
*H05K 3/00*       (2006.01)

(52) U.S. Cl.
USPC ............... 29/830; 29/847; 174/255; 174/258; 174/268

(58) Field of Classification Search
USPC ............. 29/830, 847; 174/250, 255, 258, 268
See application file for complete search history.

(56) References Cited

U.S. PATENT DOCUMENTS 3,972,755 A * 8/1976 Misfeldt .................. 216/20
5,464,662 A * 11/1995 Murakami et al. ............ 430/314
6,580,036 B2   6/2003 Kim et al.
(Continued)

FOREIGN PATENT DOCUMENTS

JP        01-287989 A      11/1989
JP        04068589 A  *   3/1992
(Continued)

OTHER PUBLICATIONS

Machine Translation of JP07273424A, obtained Dec. 15, 2012.*

(Continued)

*Primary Examiner* — Livius R Cazan
(74) *Attorney, Agent, or Firm* — Saliwanchik, Lloyd & Eisenschenk

(57) ABSTRACT

Provided is a method of manufacturing a printed circuit board including, disposing first and second insulating members and first and second conductive films on both sides of a separating member to perform a thermocompression bonding process on the first and second insulating members and the first and second conductive films on the both sides of the separating member, so as to attach the first member to the second member with the separating member therebetween and attach the first insulating member to the first conductive film and attach the second insulating member to the second conductive film, selectively removing the first and second conductive films to form first and second circuit patterns, and cutting the separating member and the first and second insulating members to separate the first and second insulating members with the first and second circuit patterns from the separating member.

5 Claims, 5 Drawing Sheets

(56) References Cited

U.S. PATENT DOCUMENTS

| | | |
|---|---|---|
| 6,884,945 B2 | 4/2005 | Kim et al. |
| 7,189,302 B2 | 3/2007 | Hwang et al. |
| 8,198,140 B2 | 6/2012 | Murai et al. |
| 2003/0168255 A1 | 9/2003 | Kim et al. |

FOREIGN PATENT DOCUMENTS

| | | | |
|---|---|---|---|
| JP | 06-093537 B | | 11/1994 |
| JP | 07-273424 A | | 10/1995 |
| JP | 07273424 A | * | 10/1995 |
| JP | 2001-308548 A | | 11/2001 |
| JP | 2003-198103 A | | 7/2003 |
| KR | 10-1999-0064553 A | | 8/1999 |
| KR | 10-2001-0009975 A | | 2/2001 |
| TW | I290755 B | | 12/2007 |

OTHER PUBLICATIONS

First Office Action Dated Mar. 7, 2012 in Chinese Application No. 20090811527.9, filed Mar. 2, 2009.

Office Action dated Apr. 17, 2012 in Japanese Application No. 2010-548626, filed Mar. 2, 2009.

Notice of Allowance dated Feb. 5, 2013 in Japanese Application No. 2010-548626, filed Mar. 2, 2009.

Office Action dated Aug. 28, 2013 in Taiwanese Application No. 098106496, filed Feb. 27, 2009.

* cited by examiner

METHOD OF MANUFACTURING PRINTED CIRCUIT BOARD

CROSS-REFERENCE TO RELATED APPLICATIONS

This application is the U.S. national stage application of International Patent Application No. PCT/KR2009/001010, filed Mar. 2, 2009, which claims priority to Korean Application Nos. 10-2008-0019337, filed Feb. 29, 2008 and 10-2008-0136022, filed Dec. 29, 2008, the disclosures of each of which are incorporated herein by reference in their entirety.

TECHNICAL FIELD

The present disclosure relates to a printed circuit board and a method of manufacturing the printed circuit board.

BACKGROUND ART

Printed circuit boards are configured to electrically connect various mounted devices by integrating interconnections. As technology develops, printed circuit boards having various types and functions, e.g., random access memories (RAMs), mainboards and local area network (LAN) cards are manufactured.

Such a printed circuit board is manufactured from a copper clad laminate (CCL) that is a base material to manufacture the printed circuit board.

The CCL includes an insulating member formed of epoxy resin and conductive layers of copper, in which the conductive layers are stacked on both surfaces of the insulating member. Interconnections of the printed circuit board are circuit patterns formed by etching the conductive layers.

A printed circuit board, in which interconnections are formed in one surface of an insulating member, is referred to as a single-sided printed circuit board, and a printed circuit board, in which interconnections are formed in both surfaces of an insulating member, is referred to as a double-sided printed circuit board.

Research has been carried out on more efficient methods of manufacturing such a single-sided printed circuit board so as to improve productivity thereof.

Also, various methods have been studied to prevent bending phenomenon of the single-sided printed circuit board.

DISCLOSURE OF INVENTION

Technical Problem

Embodiments provide a printed circuit board and a method of manufacturing the printed circuit board.

Embodiments also provide a printed circuit board adapted for improving productivity, and a method of manufacturing the printed circuit board.

Embodiments also provide a printed circuit board adapted for preventing bending phenomenon thereof, and a method of manufacturing the printed circuit board.

Technical Solution

In one embodiment, a method of manufacturing a printed circuit board includes: disposing first and second insulating members and first and second conductive films on both sides of a separating member to perform a thermocompression bonding process on the first and second insulating members and the first and second conductive films on the both sides of the separating member, so as to attach the first member to the second member with the separating member therebetween and attach the first insulating member to the first conductive film and attach the second insulating member to the second conductive film; selectively removing the first and second conductive films to form first and second circuit patterns; and cutting the separating member and the first and second insulating members to separate the first and second insulating members with the first and second circuit patterns from the separating member.

In another embodiment, a printed circuit board includes: an insulating member, a lower region of which is greater than an upper region thereof in thermal expansion coefficient; a circuit pattern on the insulating member; and a solder resist selectively disposed on the circuit pattern and the insulating member.

In further another embodiment, a method of manufacturing a printed circuit board includes: disposing a second insulating member, a first insulating member on the second insulating member, and a conductive film on the first insulating member to perform a thermocompression bonding process on the second insulating member, the first insulating member, and the conductive film, the second insulating member having a second thermal expansion coefficient, the first insulating member having a first thermal expansion coefficient less than the second thermal expansion coefficient; selectively removing the conductive film to form a circuit pattern; and selectively forming a solder resist on the first insulating member with the circuit pattern.

In still further another embodiment, a method of manufacturing a printed circuit board includes: disposing a second insulating member on a side of a separating member, a first insulating member on a side of the second insulating member, a first conductive film on a side of the first insulating member, a fourth insulating member on another side of the separating member, a third insulating member on an opposite side of the fourth insulating member to the separating member, and a second conductive film on an opposite side of the third insulating member to the fourth insulating member, to perform a thermocompression bonding process on the second insulating member, the first insulating member, the conductive film, the fourth insulating member, the third insulating member, the second conductive film, and the separating member, the second insulating member having a second thermal expansion coefficient, the first insulating member having a first thermal expansion coefficient less than the second thermal expansion coefficient, the fourth insulating member having the second thermal expansion coefficient, the third insulating member having the first thermal expansion coefficient; selectively removing the first and second conductive films to form first and second circuit patterns; selectively forming a solder resist on the first and second insulating members with the first and second circuit patterns; and cutting the solder resist, the first insulating member, the second insulating member, the third insulating member, the fourth insulating member, and the separating member, to separate, from the separating member, a single-sided printed circuit board including the first and second insulating members and the solder resist, and a single-sided printed circuit board including the third and fourth insulating members and the solder resist.

The details of one or more embodiments are set forth in the accompanying drawings and the description below. Other features will be apparent from the description and drawings, and from the claims.

Advantageous Effects

According to the embodiments, the printed circuit board and the method of manufacturing the printed circuit board are provided.

Also, the productivity of the printed circuit board can be improved.

Also, the bending phenomenon can be prevented.

MODE FOR THE INVENTION

Figure 1:
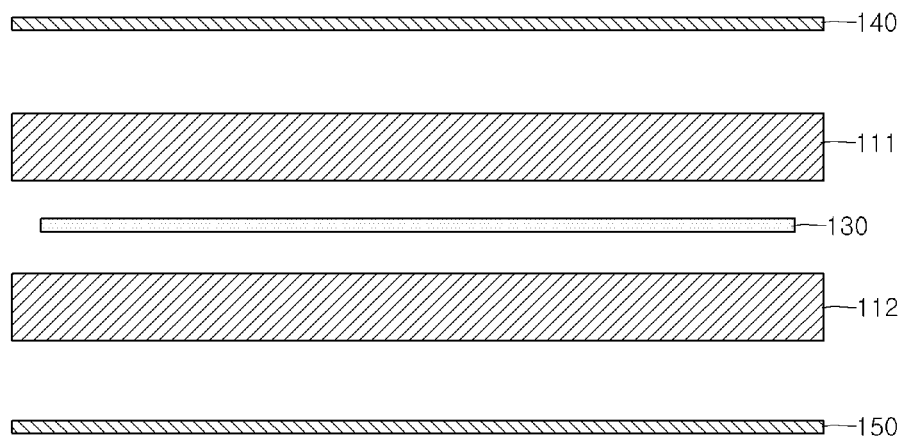
FIGS. 1 to 4 are schematic views illustrating a printed circuit board and a method of manufacturing the printed circuit board according to an embodiment.

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Reference will now be made in detail to the embodiments of the present disclosure, examples of which are illustrated in the accompanying drawings.

FIGS. 1 to 4 are schematic views illustrating a printed circuit board and a method of manufacturing the printed circuit board according to one embodiment.

Referring to FIG. 1, a first insulating member 111, a second insulating member 112, a first conductive film 140, a second conductive film 150, and a separating member 130 are prepared to manufacture the printed circuit board.

The first and second insulating members 111 and 112 function as basic members of the printed circuit board, and the first and second conductive films 140 and 150 are provided in a thin film shape of conductive material, e.g., copper.

The first and second insulating members 111 and 112 may be formed of resin including a glass fiber. For example, epoxy resin or phenol resin may be used as the resin.

The separating member 130 is formed of a material that tends not to adhere to the first and second insulating members 111 and 112 during a thermocompression bonding process. For example, when the first and second insulating members 111 and 112 are formed of the epoxy resin, the separating member 130 may be provided in a film shape, an outer surface of which is coated with silicon.

Figure 2:
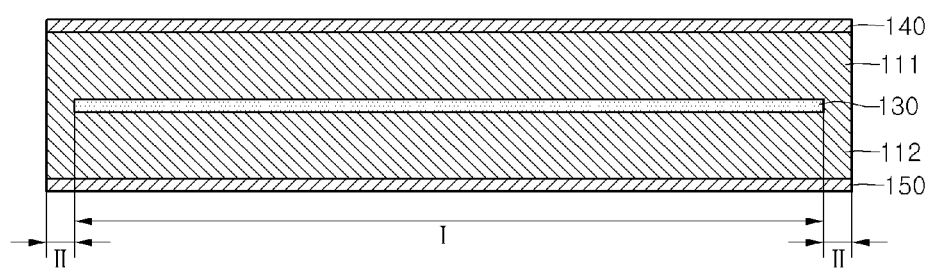

Referring to FIG. 2, the first conductive film 140, the first insulating member 111, the separating member 130, the second insulating member 112, and the second conductive film 150 disposed as illustrated in FIG. 1 are attached to each other through the thermocompression bonding process.

Since the first and second insulating members 111 and 112 are greater than the separating member 130 in area, the first and second insulating members 111 and 112 directly and partially face each other.

The thermocompression bonding process melts the first and second insulating members 111 and 112 to be efficiently attached to each other, and then firmly coupled through a curing process.

At this point, the separating member 130 is not attached to the first and second insulating members 111 and 112, but the first and second insulating members 111 and 112 are attached to each other.

The first and second conductive films 140 and 150 are respectively attached to the first and second insulating members 111 and 112 through the thermocompression bonding process.

Thus, the structure illustrated in FIG. 2 may be divided into a first region I corresponding to the separating member 130 between the first and second insulating members 111 and 112 and a second region II.

That is, as illustrated in FIG. 2, the first region I is located in a center region of the structure, and the second region II is disposed in a peripheral region thereof. The first and second insulating members 111 and 112 are attached to each other through the second region II.

Figure 3:
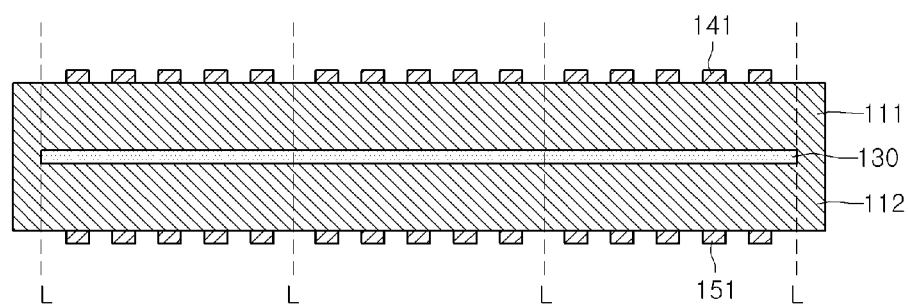

Referring to FIG. 3, the first and second conductive films 140 and 150 are selectively removed through a dry etching process or a wet etching process so as to form a first circuit pattern 141 on the first insulating member 111, and to form a second circuit pattern 151 on the second insulating member 112.

After forming the first and second circuit patterns 141 and 151, a solder resist (not shown) may be disposed on the first and second insulating members 111 and 112 with the first and second circuit patterns 141 and 151, or a plating layer (not shown) may be disposed on the first and second circuit patterns 141 and 151.

Figure 4:
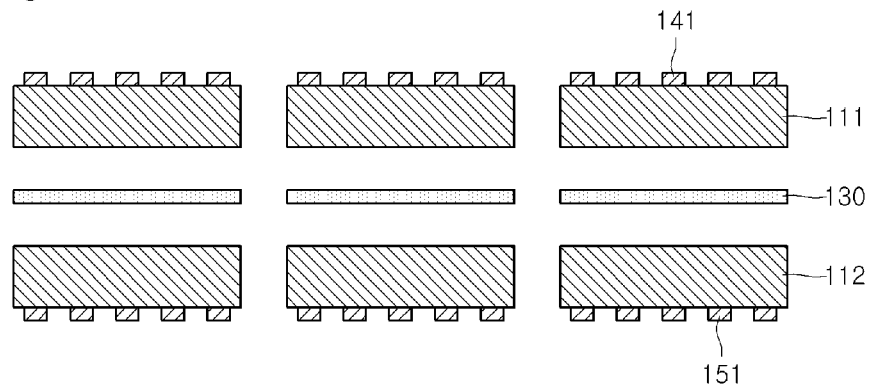

Referring to FIG. 4, the structure illustrated in FIG. 3 is cut along line L.

Since the first and second insulating members 111 and 112 are not attached to the separating member 130, when the cutting is performed along the line L, the first and second insulating members 111 and 112 are separated from each other.

Thus, a plurality of single-sided printed circuit boards can be simultaneously manufactured in a single process, thereby improving productivity.

Surfaces of the single-sided printed circuit boards without the first and second circuit patterns 141 and 151 have no conductive layer, and thus a process of forming a solder resist is not required for the surfaces having no circuit pattern, thereby simplifying the manufacturing process and reducing the thickness of the printed circuit board.

Figure 5:
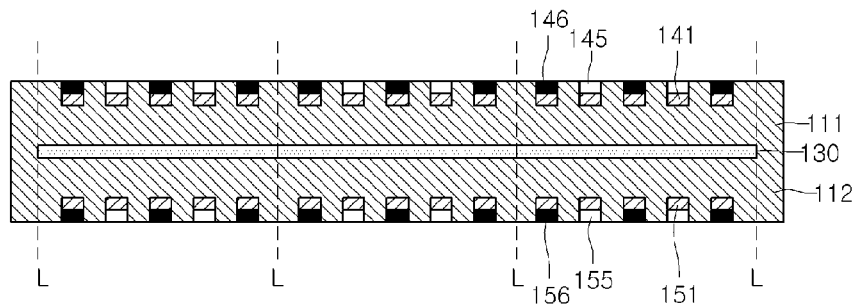
FIGS. 5 and 6 are views illustrating a printed circuit board and a method of manufacturing the printed circuit board according to another embodiment.
Figure 6:
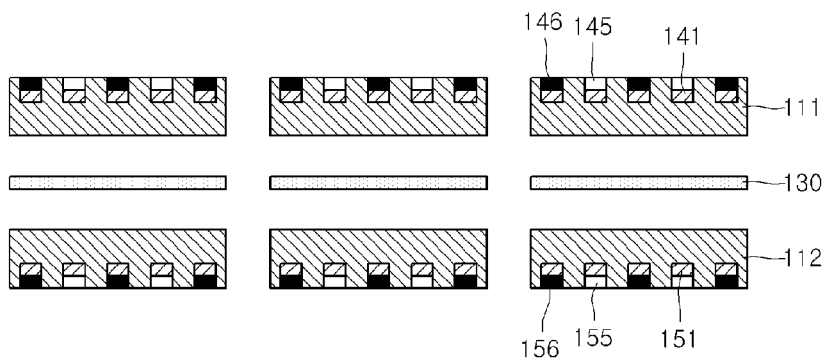

FIGS. 5 and 6 are views illustrating a printed circuit board and a method of manufacturing the printed circuit board according to another embodiment.

Since the process described in the previous embodiment of FIGS. 1 to 3 is used in the current embodiment, the description corresponding to FIGS. 1 to 3 will be omitted in description of the printed circuit board and the manufacturing method according to the current embodiment.

A difference is that the first and second insulating members 111 and 112 attached through the thermocompression bonding process in the process of FIG. 2 are half cured, not fully cured. In this state, the first and second circuit patterns 141 and 151 are formed as illustrated in FIG. 3.

Referring to FIG. 5, when the thermocompression bonding process is performed on the first and second circuit patterns 141 and 151 with the half cured first and second insulating members 111 and 112, the first and second circuit patterns 141 and 151 are embedded into the first and second insulating members 111 and 112, respectively.

Plating layers 145 and 155 and oxide layers 146 and 156 are formed selectively on the embedded first and second circuit patterns 141 and 151.

That is, the first and second circuit patterns 141 and 151 include a portion electrically connected to other electronic devices, and the other portion provided with the oxide layers 146 and 156. The portion electrically connected to the electronic devices is provided with the plating layers 145 and 155.

The plating layers 145 and 155 may be formed of Au or Ni, and the oxide layers 146 and 156 are formed by oxidizing the surfaces of the first and second circuit patterns 141 and 151. The oxide layers 146 and 156 function as the solder resist.

Referring to FIG. 6, the structure illustrated in FIG. 5 is cut along the line L.

Since the first and second insulating members 111 and 112 are not attached to the separating member 130, when the first and second insulating members 111 and 112 are cut along the line L, the first and second insulating members 111 and 112 are separated from each other.

Thus, a plurality of single-sided printed circuit boards can be simultaneously manufactured in a single process, thereby improving productivity.

Surfaces of the single-sided printed circuit boards without the first and second circuit patterns 141 and 151 have no conductive layer, and thus a process of forming a solder resist is not required for the surfaces having no circuit pattern, thereby simplifying the manufacturing process and reducing the thickness of the printed circuit board.

Also, since the first and second circuit patterns 141 and 151 are embedded in the first and second insulating members 111 and 112, the printed circuit board according to the current embodiment has the smaller thickness than the printed circuit board illustrated in FIG. 4. When the printed circuit board illustrated in FIG. 4 and the printed circuit board illustrated in FIG. 6 are equal in thickness, the first and second insulating members 111 and 112 of the printed circuit board illustrated in FIG. 6 can have the greater thickness, and thus improving characteristic against bending phenomenon of the printed circuit board.

FIGS. 7 to 10 are schematic views illustrating a printed circuit board and a method of manufacturing the printed circuit board according to another embodiment.

Figure 7:
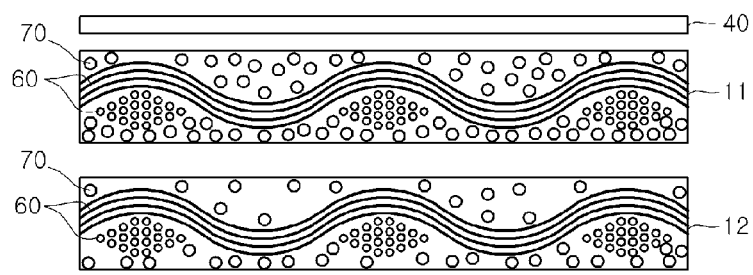
FIGS. 7 to 10 are views illustrating a printed circuit board and a method of manufacturing the printed circuit board according to another embodiment.

Referring to FIG. 7, a first insulating member 11 and a second insulating member 12, and a first conductive film 40 are prepared to manufacture the printed circuit board.

The first insulating member 11 and the second insulating member 12 function as basic members of the printed circuit board, and the first conductive film 40 is provided in a thin film shape of conductive material, e.g., copper.

The first and second insulating members 11 and 12 may be formed of resin including glass fibers 60 and a filler 70. For example, epoxy resin or phenol resin may be used as the resin.

The glass fibers 60 are perpendicular to each other in the respective first and second insulating members 11 and 12 so as to reinforce the first and second insulating members 11 and 12.

The filler 70 may be formed of, e.g., silica, and the amount of the filler 70 included in the first insulating member 11 is greater than that of the filler 70 included in the second insulating member 12.

The printed circuit board according to the current embodiment prevents the bending phenomenon thereof by using the first and second insulating members 11 and 12 different in the amount of the filler 70.

The first insulating member 11, having the greater amount of the filler 70, is provided as a member having a low thermal expansion coefficient, and the second insulating member 12, having the less amount of the filler 70, is provided as a member having a high thermal expansion coefficient.

For example, the first insulating member 11 may have a first thermal expansion coefficient of about 11-12 ppm/° C. and the second insulating member 12 may have a second thermal expansion coefficient of about 13-14 ppm/° C.

A circuit pattern and a solder resist are disposed on the first insulating member 11, and the second insulating member 12 has the high thermal expansion coefficient to match with the solder resist in thermal expansion coefficient.

Figure 8:
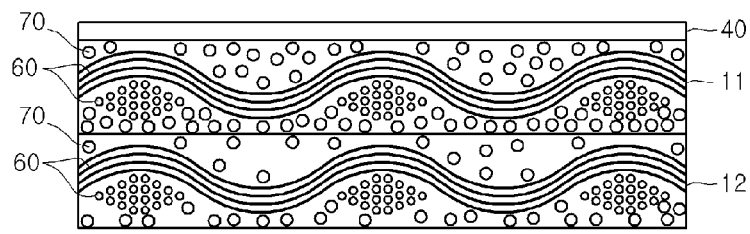
Figure 9:
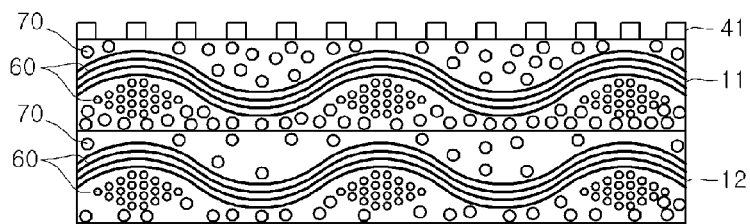

Referring to FIGS. 8 and 9, the first conductive film 40, the first and second insulating members 11 and 12 are attached to each other through a thermocompression bonding process.

The first conductive film 40 is selectively removed through a dry etching process or a wet etching process so as to form a first circuit pattern 41 on the first insulating member 11.

Figure 10:
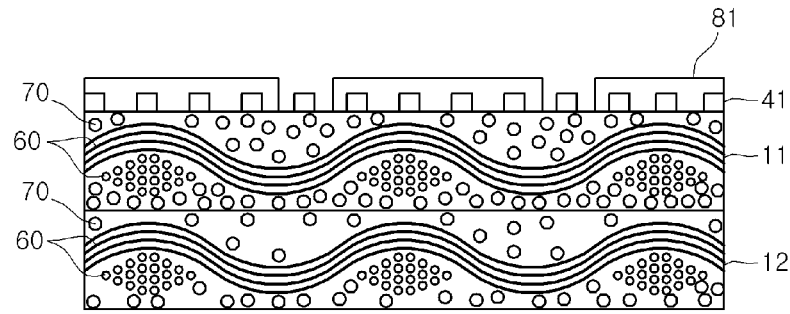

Referring to FIG. 10, a solder resist 81 is formed on the first circuit pattern 41, and a plating layer (not shown) is formed on the first circuit pattern 41 without the solder resist 81, thereby manufacturing the printed circuit board according to the current embodiment.

As described above, the printed circuit board according to the current embodiment prevents the bending phenomenon thereof by stacking the first insulating member 11 having the first thermal expansion coefficient, and the second insulating member 12 having the second thermal expansion coefficient greater than the first thermal expansion coefficient, and then by forming the first circuit pattern 41 and the solder resist 81 on the first insulating member 11.

Although the first and second insulating members 11 and 12 are exemplified as an insulating member of the printed circuit board in the current embodiment, a single insulating member in which the amount of the filler 70 is different according to positions, or three or more insulating members may be used to manufacture a printed circuit board in other embodiments.

FIGS. 11 to 15 are schematic views illustrating a printed circuit board and a method of manufacturing the printed circuit board according to another embodiment in which the same description as that of the previous embodiment will be omitted.

Figure 11:
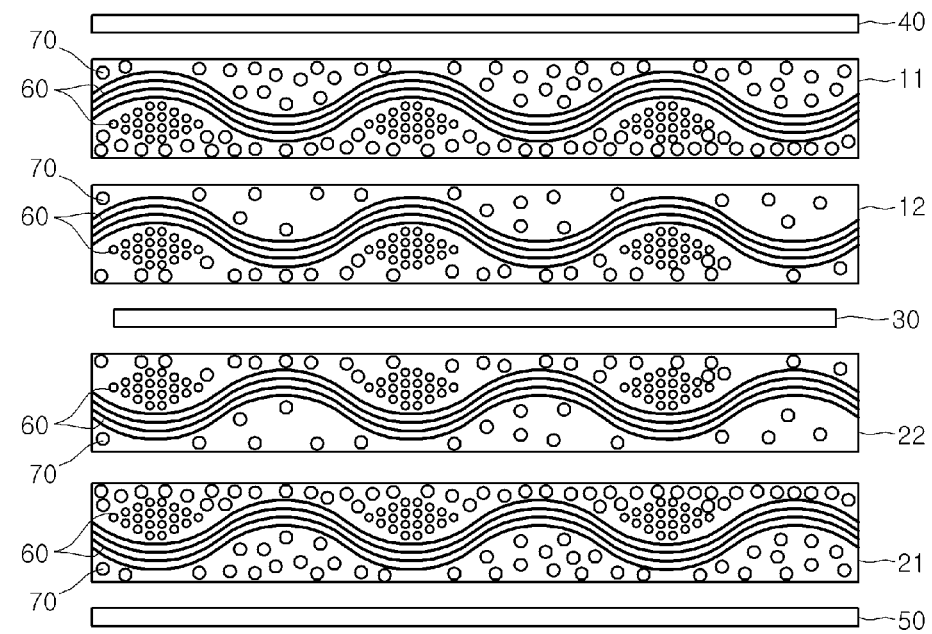
FIGS. 11 to 15 are views illustrating a printed circuit board and a method of manufacturing the printed circuit board according to another embodiment.

Referring to FIG. 11, the first conductive film 40, the first insulating member 11, the second insulating member 12, a separating member 30, a second conductive film 50, a third insulating member 21, and a fourth insulating member 22 are prepared to manufacture the printed circuit board.

The first through fourth insulating members 11, 12, 21, and 22 function as a basic member of the printed circuit board, and the first and second conductive films 40 and 50 are provided in a thin film shape of conductive material, e.g., copper.

The first through fourth insulating members 11, 12, 21, and 22 may be formed of resin including the glass fibers 60 and the filler 70. For example, epoxy resin or phenol resin may be used as the resin.

The glass fibers 60 are perpendicular to each other in the respective first through fourth insulating members 11, 12, 21, and 22 so as to reinforce the first through fourth insulating members 11, 12, 21, and 22.

The filler 70 may be formed of, e.g., silica, and the amount of the filler 70 included in the first insulating member 11 is greater than that of the filler 70 included in the second insulating member 12. The amount of the filler 70 included in the third insulating member 21 is greater than that of the filler 70 included in the fourth insulating member 22.

The printed circuit board according to the current embodiment prevents the bending phenomenon thereof by using the first and second insulating members 11 and 12 different in the amount of the filler 70 and the third and fourth insulating members 21 and 22 different in the amount of the filler 70.

The first insulating member 11, having the greater amount of the filler 70, is provided as a member having a low thermal expansion coefficient, and the second insulating member 12, having the less amount of the filler 70, is provided as a member having a high thermal expansion coefficient.

For example, the first insulating member 11 may have a first thermal expansion coefficient of about 11-12 ppm/° C. and the second insulating member 12 may have a second thermal expansion coefficient of about 13-14 ppm/° C.

The third insulating member 21, having the great amount of the filler 70, is provided as a member having a low thermal expansion coefficient, and the fourth insulating member 22, having the small amount of the filler 70, is provided as a member having a high thermal expansion coefficient.

For example, the third insulating member 21 may have the first thermal expansion coefficient of about 11-12 ppm/° C. and the fourth insulating member 22 may have the second thermal expansion coefficient of about 13-14 ppm/° C.

A circuit pattern and a solder resist are disposed on the first and third insulating members 11 and 21, and the second and fourth insulating members 12 and 22 have the high thermal expansion coefficient to match with the solder resist in thermal expansion coefficient.

The separating member 30 is formed of a material that tends not to adhere to the second and fourth insulating members 12 and 22 during a thermocompression bonding process. For example, when the second and fourth insulating members 12 and 22 are formed of epoxy resin, the separating member 30 may be provided in a film shape, an outer surface of which is coated with silicon.

Figure 12:
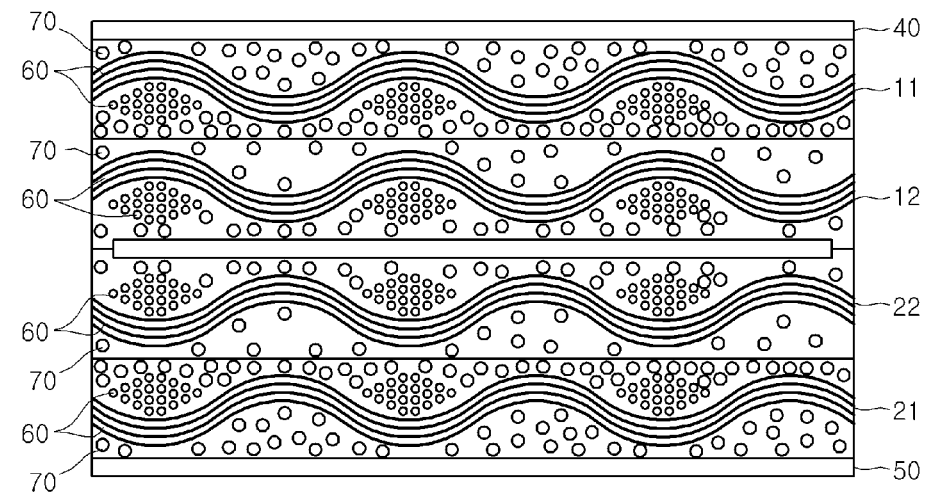

Referring to FIG. 12, the first conductive film 40, the first insulating member 11, the second insulating member 12, the separating member 30, the second conductive film 50, the third insulating member 21, and the fourth insulating member 22 in the state as illustrated in FIG. 11 are attached through the thermocompression bonding process.

At this point, the separating member 30 is not attached to the second insulating member 12 and the fourth insulating member 22, but the second insulating member 12 is attached to the fourth insulating member 22.

Figure 13:
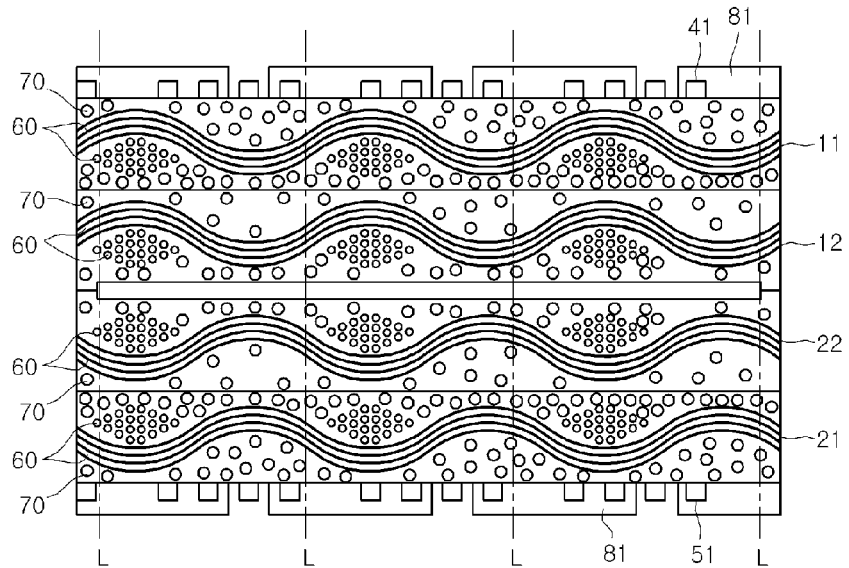

Referring to FIG. 13, the first and second conductive films 40 and 50 are selectively removed through a dry etching process or a wet etching process so as to form the first circuit pattern 41 on the first insulating member 11 and form a second circuit pattern 51 on the third insulating member 21.

The solder resist 81 is formed on the first and second circuit patterns 41 and 51, and a plating layer (not shown) is formed on the first and second circuit patterns 41 and 51 without the solder resist 81.

Figure 14:
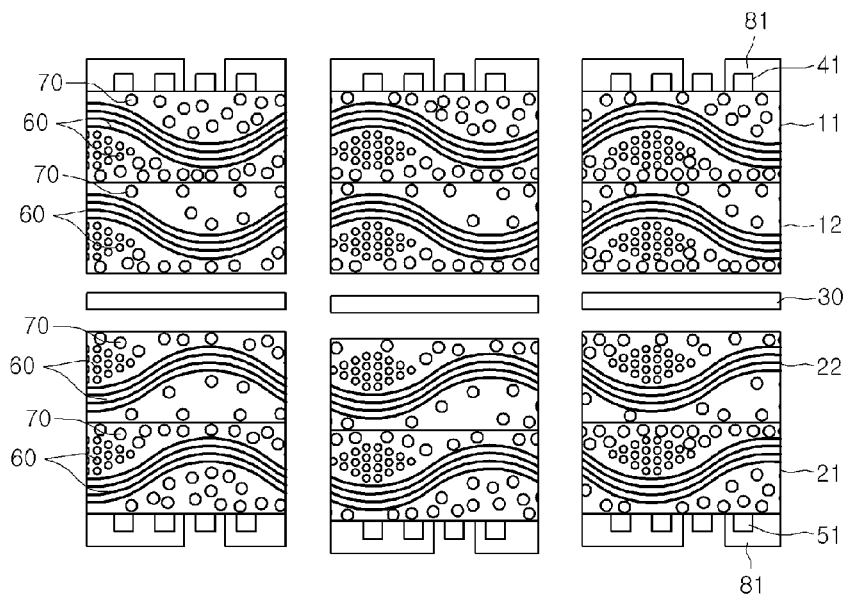

Referring to FIG. 14, the structure as illustrated in FIG. 13 is cut along the line L.

Figure 15:
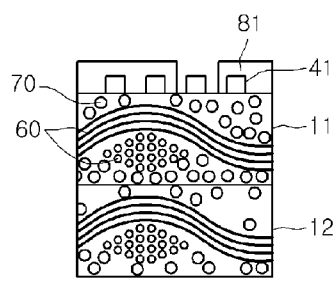

Since the separating member 30 is not attached to the second and fourth insulating members 12 and 22, when the structure is cut along the line L, a plurality of single-sided printed circuit boards as illustrated in FIG. 15 can be simultaneously manufactured in a single process, thereby improving productivity.

As described above, the printed circuit board according to the current embodiment is adapted to simultaneously manufacture a plurality of single-sided printed circuit boards by disposing the second and fourth insulating members 12 and 22 having the second thermal expansion coefficient on both sides of the separating member 30, and by disposing the first and third insulating members 11 and 21 having the first thermal expansion coefficient smaller than the second thermal expansion coefficient on the second and fourth insulating members 12 and 22, and the printed circuit board is not bent although forming the solder resist 81 on the first and third insulating members 11 and 21.

Figure 16:
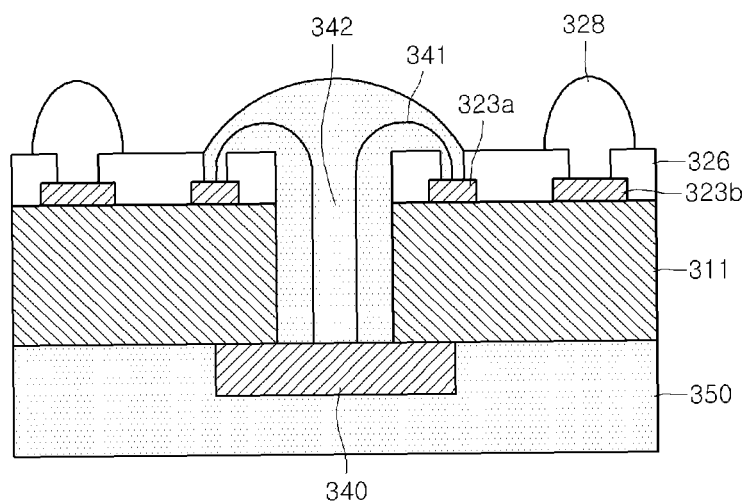
FIG. 16 is a cross-sectional view illustrating a printed circuit board assembly to which a single-sided printed circuit board according to embodiments is applied.

FIG. 16 is a cross-sectional view illustrating a printed circuit board assembly to which single-sided printed circuits board according to embodiments are applied.

Various electronic devices are mounted on the printed circuit board manufactured according to the aforementioned manufacturing process, which is exemplified in FIG. 16 that illustrates the structure of a random access memory (RAM) employing the single-sided printed circuit board. An electronic device 340 is mounted on the printed circuit board of the RAM.

In the printed circuit board according to the embodiments, a circuit pattern 323$a$ and a solder resist 326 are provided to just one surface of an insulating member 311.

The electronic device 340 is mounted on the opposite surface to the surface with circuit patterns 323$a$ and 323$b$. The circuit patterns 323$a$ and 323$b$ may form a connection terminal for electrically connecting to other electronic devices or an external substrate.

The insulating member 311 is provided with a through hole 342 for electrically connecting the electronic device 340 and the circuit pattern 323$a$, and the electronic device 340 is connected to the circuit pattern 323$a$ by a wire 341 passing through the through hole 342. The wire 341 may be formed of Au, and a plating layer formed of Au may be formed on the circuit pattern 323$a$.

A solder ball 328, for mounting the RAM on a main board, is disposed on the circuit pattern 323$b$.

A passivation layer 350, physically and electrically protecting the electronic device 340 from an outside, is further stacked on the insulating member 311. The passivation layer 350 may be formed of, e.g., epoxy resin.

The passivation layer 350 is formed by applying resin on the printed circuit board of FIG. 16 in the upside-down state thereof, and the resin covers the wire 341 and the circuit pattern 323$a$, passing through the through hole 342.

The passivation layer 350 and the insulating member 311 may include the same resin-based component for more firmly adhering to each other. For example, when the insulating member 311 includes an epoxy-resin-based component, the passivation layer 350 includes the epoxy-resin-based component, so that the insulating member 311 more firmly adheres to the passivation layer 350.

As such, the single-sided printed circuit board is applied to realize the printed circuit board assembly, thereby slimming the printed circuit board assembly and improving reliability of a product.

The method of manufacturing the printed circuit board as described above is not limited to sequentially perform the aforementioned processes, rather the processes are selectively combined with each other according to design specifications. Thus, the configuration of a printed circuit board manufactured by selectively combining the processes also includes various variations and modifications within the spirit and scope of the principles of this disclosure.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Industrial Applicability

According to the embodiments, the printed circuit board and the method of manufacturing the printed circuit board can be used in various electronic devices.

The invention claimed is:

1. A method of manufacturing a printed circuit board, the method comprising:
   disposing first and second insulating members and first and second conductive films on both sides of a separating member to perform a thermocompression bonding process on the first and second insulating members and the first and second conductive films on the both sides of the separating member, so as to attach the first member to the second member with the separating member therebetween and attach the first insulating member to the first conductive film and attach the second insulating member to the second conductive film;
   selectively removing the first and second conductive films to form first and second circuit patterns;
   after the forming of the first and second circuit patterns, embedding the first and second circuit patterns in the first and second insulating members, wherein a distance between an exposed surface of the first insulating member and the separating member is greater than a distance between an exposed surface of the first circuit pattern and the separating member, wherein a distance between an exposed surface of the second insulating member and the separating member is greater than a distance between an exposed surface of the second circuit pattern and the separating member, and wherein all distances are taken in a direction approximately perpendicular to the exposed surface of the first insulating member;
   selectively plating or oxidizing the first and second circuit patterns; and
   cutting the separating member and the first and second insulating members to separate the first and second insulating members with the first and second circuit patterns from the separating member.

2. The method according to claim 1, wherein the first and second insulating members comprise epoxy resin or phenol resin, and the separating member has an outer surface coated with silicon.

3. The method according to claim 1, wherein the first and second insulating members are divided into a first region overlapping the separating member and a second region, and
   the first and second insulating members are attached to each other in the second region.

4. The method according to claim 1, wherein the first and second circuit patterns are embedded through the thermocompression bonding process in a state where the first and second insulating members are half cured.

5. The method according to claim 1, wherein the first and second insulating members comprise adjacent portions to the separating member and adjacent portions to the first and second conductive films, and
   the adjacent portions to the separating member are greater than the adjacent portions to the first and second conductive films in thermal expansion coefficient.

* * * * *